United States Patent
Müller-Meskamp et al.

(10) Patent No.: US 12,557,360 B2
(45) Date of Patent: Feb. 17, 2026

(54) LATERAL HIGH VOLTAGE SEMICONDUCTOR DEVICE AND METHOD FOR FORMING A LATERAL HIGH VOLTAGE SEMICONDUCTOR DEVICE

(71) Applicant: Infineon Technologies Austria AG, Villach (AT)

(72) Inventors: Lars Müller-Meskamp, Dresden (DE); Ralf Rudolf, Dresden (DE); Franz Hirler, Isen (DE); Fabian Geisenhof, Munich (DE); Tom Peterhänsel, Dresden (DE); Annett Winzer, Dresden (DE); Dirk Priefert, Moers (DE); Thomas Künzig, Baldham (DE); Felix Simon Winterer, Munich (DE); Dirk Manger, Dresden (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 18/897,009

(22) Filed: Sep. 26, 2024

(65) Prior Publication Data
US 2025/0113567 A1  Apr. 3, 2025

(30) Foreign Application Priority Data
Sep. 28, 2023  (DE) .......................... 102023209535.1

(51) Int. Cl.
*H10D 62/10* (2025.01)
*H10D 30/01* (2025.01)
(Continued)

(52) U.S. Cl.
CPC ....... *H10D 62/127* (2025.01); *H10D 30/0281* (2025.01); *H10D 30/65* (2025.01); *H10D 62/107* (2025.01); *H10D 64/112* (2025.01)

(58) Field of Classification Search
CPC .. H10D 30/0281; H10D 30/65; H10D 62/106; H10D 62/107; H10D 62/127; H10D 64/111; H10D 64/112; H10D 64/117
(Continued)

(56) References Cited

U.S. PATENT DOCUMENTS

| | | | |
|---|---|---|---|
| 2008/0203496 A1* | 8/2008 | Takahashi | H10D 64/112 |
| | | | 257/E29.027 |
| 2010/0283116 A1* | 11/2010 | Shimizu | H03K 17/161 |
| | | | 257/500 |

(Continued)

FOREIGN PATENT DOCUMENTS

| | | |
|---|---|---|
| DE | 102013215378 A1 | 4/2014 |
| DE | 112016007213 B4 | 5/2022 |

*Primary Examiner* — Fazli Erdem
(74) *Attorney, Agent, or Firm* — Murphy, Bilak & Homiller, PLLC (57) ABSTRACT

A lateral high voltage semiconductor device includes a semiconductor substrate with a frontside and a semiconductor element. The semiconductor element includes: a first semiconductor region of a first conductivity type formed within the semiconductor substrate; a second semiconductor region formed within the semiconductor substrate and spaced apart from the first semiconductor region in a first lateral direction parallel to the frontside; and an extension region adjoining the second semiconductor region. The semiconductor device is configured to control a load current between the first and second semiconductor regions. The extension region extends along the frontside of the semiconductor substrate and includes at least one mesa protruding at the frontside of the semiconductor substrate.

24 Claims, 7 Drawing Sheets

(51) Int. Cl.
*H10D 30/65* (2025.01)
*H10D 64/00* (2025.01)

(58) Field of Classification Search
USPC .......................................... 257/343
See application file for complete search history.

(56) References Cited

U.S. PATENT DOCUMENTS

| | | | |
|---|---|---|---|
| 2014/0217466 A1* | 8/2014 | Yamaji | H10D 30/603 |
| | | | 257/140 |
| 2017/0222043 A1* | 8/2017 | Hirler | H10D 62/111 |
| 2024/0290882 A1* | 8/2024 | Winzer | H01L 21/76224 |
| 2024/0363700 A1* | 10/2024 | Mueller-Meskamp | |
| | | | H10D 30/65 |

* cited by examiner

LATERAL HIGH VOLTAGE SEMICONDUCTOR DEVICE AND METHOD FOR FORMING A LATERAL HIGH VOLTAGE SEMICONDUCTOR DEVICE

TECHNICAL FIELD

The present disclosure relates to a lateral high voltage semiconductor device. More particular, the lateral high voltage semiconductor device may be a lateral power device having a breakdown voltage of at least 80 V or even at least 300 V. For example, the present disclosure may relate to gate driver comprising a high voltage domain and a low voltage domain.

BACKGROUND

HV (high-voltage) semiconductor devices in CMOS technology (complementary metal oxide semiconductors) form or include an interface between standard CMOS devices with input voltages below 5V on the one hand and industrial or consumer circuits operating at voltages above 30V on the other hand. Applications for such HV semiconductor devices exist in robotics, the automotive industry and as drivers for MEMS (micro electromechanical systems). Typically, most of the signal processing is done at low operating voltage in a CMOS part and only the output signal interface to and/or the input signal interface operates at higher signal levels and/or requires higher current driving and sinking capability. An example of such a HV semiconductor device is a gate driver circuit that enables a microcontroller or DSP (digital signal processor) to efficiently turn on and off power semiconductor switches. Signals containing information about the operation of the power semiconductor switches can be fed back to the CMOS part from the interfaces to the power semiconductor switches.

There is a constant need to further improve data exchange between different parts of a high voltage semiconductor device such as a gate driver circuit with little additional effort.

SUMMARY

The general invention relates to a lateral high voltage semiconductor device, the high voltage semiconductor device comprising a semiconductor substrate with a frontside and a semiconductor device. The semiconductor device comprises a first semiconductor region of a first conductivity type formed within the semiconductor substrate, a second semiconductor region formed within the semiconductor substrate spaced apart from the first semiconductor region in a first lateral direction parallel to the frontside, and an extension region adjoining the second semiconductor region, wherein the semiconductor device is configured to control a lateral load current between the first semiconductor region and the second semiconductor region.

An embodiment of the present disclosure relates to a lateral high voltage semiconductor device, the high voltage semiconductor device comprising a semiconductor substrate with a frontside and a semiconductor device region. The semiconductor element comprises a first semiconductor region of a first conductivity type formed within the semiconductor substrate, a second semiconductor region formed within the semiconductor substrate spaced apart from the first semiconductor region in a first lateral direction parallel to the frontside, and an extension region adjoining the second semiconductor region, wherein the semiconductor device is configured to control a lateral load current between the first semiconductor region and the second semiconductor region and wherein the extension region is extending along the frontside of the semiconductor substrate and comprises at least one mesa protruding at the frontside of the semiconductor substrate.

Another embodiment of the present disclosure relates to a lateral high voltage semiconductor device, comprising a semiconductor substrate with a frontside and a semiconductor element. The semiconductor element comprises a first semiconductor region of a first conductivity type formed within the semiconductor substrate, a second semiconductor region spaced apart from the first semiconductor region in a first lateral direction parallel to the frontside, and an extension region adjoining the second semiconductor region, wherein the semiconductor device is configured to control a lateral load current between the first semiconductor region and the second semiconductor region. The high voltage semiconductor device further comprises a first field plate structure in electrical connection to the first semiconductor region, and a second field plate structure in electrical connection to the second semiconductor region, wherein at least one of the first and the second field plate structure comprises a stack of at least three interconnected field plates above each other, wherein at least one of the field plates of the stack comprises polysilicon and at least one of the field plates of the stack comprises a metal.

Another embodiment of the present disclosure relates to a lateral high voltage semiconductor device, comprising a semiconductor substrate with a frontside and a semiconductor element, the semiconductor element comprising: A first semiconductor region of a first conductivity type formed within the semiconductor substrate, a second semiconductor region spaced apart from the first semiconductor region in a first lateral direction parallel to the frontside, and an extension region adjoining the second semiconductor region, wherein the semiconductor device is configured to control a lateral load current between the first semiconductor region and the second semiconductor region. The high voltage semiconductor device further comprises a first field plate structure in electrical connection to the first semiconductor region, a second field plate structure in electrical connection to the second semiconductor region, a third field plate structure in electrical connection to a first portion of the extension region, and fourth field plate structure in electrical connection to a second portion of the extension region, wherein the third field plate structure is connected to the first portion of the extension region at a side of the third field plate structure closer to the first semiconductor region along first lateral direction than a centroid of the third field plate structure, and wherein the fourth field plate structure is connected to the second portion of the extension region at a side of the fourth field plate structure closer the second semiconductor region along first lateral direction than a centroid of the fourth field plate structure.

The at least one mesa protruding from the frontside along the extension region and/or the respective field plate structures being arranged along the extension region allow for improved electrical performance of the lateral high voltage semiconductor device.

Those skilled in the art will recognize additional features and advantages upon reading the following detailed description, and upon viewing the accompanying drawings.

BRIEF DESCRIPTION OF THE DRAWINGS

The present disclosure is illustrated by way of example, and not by way of limitation, in the figures of the accompanying drawings in which like reference numerals refer to similar or identical elements. The elements of the drawings are not necessarily to scale relative to each other. The features of the various illustrated examples can be combined unless they exclude each other.

DETAILED DESCRIPTION

The examples described herein provide embodiments of a lateral high voltage semiconductor device. The lateral high voltage semiconductor device may have a breakthrough voltage of at least 80 V or even at least 300 V.

Embodiments of the present disclosure relate to a lateral high voltage semiconductor device, the high voltage semiconductor device comprising a semiconductor substrate with a frontside and a semiconductor device region. The semiconductor element comprises a first semiconductor region of a first conductivity type formed within the semiconductor substrate, a second semiconductor region formed within the semiconductor substrate spaced apart from the first semiconductor region in a first lateral direction parallel to the frontside, and an extension region adjoining the second semiconductor region, wherein the semiconductor device is configured to control a lateral load current between the first semiconductor region and the second semiconductor region and wherein the extension region is extending along the frontside of the semiconductor substrate. In a section through the device, the lateral load current may flow in parallel to the first lateral direction.

The first semiconductor region may be arranged close to or at the frontside of the semiconductor substrate. The second semiconductor region may be arranged close to or at the frontside of the semiconductor substrate.

The extension region may have the same conductivity type as the second semiconductor region but with lower doping concentration compared to the second region. The average doping concentration within the extension region may be at least one magnitude or at least two magnitudes or even at least three magnitudes smaller compared to the second semiconductor region. The extension region may be configured to take over a blocking voltage of the semiconductor element or, respectively, the semiconductor device in a blocking state of the semiconductor element. Therefore, in the blocking state, at least 50% of the breakdown voltage of the semiconductor device may drop at the extension region. The extension region may be configured to relax the electrical field between the first and second semiconductor region. The extension region may extend primarily in the lateral direction parallel to the frontside. Hence, a main extension direction of the extension region may be parallel to the frontside of the substrate. The extension region may be arranged close to or at the frontside of the semiconductor substrate.

The semiconductor element may implement an electronic component or an electronic device. For example, the semiconductor element may be a transistor (e.g. a bipolar junction transistor, BJT, or a field effect transistor, FET, or a junction-gate field-effect transistor, JFET), or a diode (e.g. a pn-diode or a Zener diode), or an insulated gate bipolar transistor, IGBT, or a thyristor, or the like.

In case of the semiconductor element being a transistor, the semiconductor element may further comprise a body region of a second conductivity type laterally adjoining the first semiconductor region and the extension region, and a gate structure configured to control the lateral load current between the first and the second semiconductor region. The gate region may be insulated from the body region. The gate region may be configured to form an inversion channel in the body region for controlling the lateral load current. The first semiconductor region may be a source or emitter region of the transistor and the second semiconductor region may be a drain or collector region of the transistor. The first region may adjoin the body region. The body region may adjoin the extension region. The second semiconductor region may have the first conductivity type. The extension region may also have the first conductivity type.

In case of the semiconductor element being a diode, the first semiconductor region may be an anode and the second semiconductor region may be a cathode of the semiconductor element. The first and second semiconductor region may have an opposite conductivity type. For example, the first semiconductor region may have the first conductivity type and the second semiconductor region may have the second conductivity type. The extension region may also have the second conductivity type. The first region may adjoin the extension region. The pn junction may be formed between the first semiconductor region and the extension region.

According to some embodiments, the lateral high voltage semiconductor device comprises at least one mesa protruding at the frontside of the semiconductor substrate.

Alternatively or additionally to the protruding at least one mesa, the lateral high voltage semiconductor device may comprise a first field plate structure in electrical connection to the first semiconductor region, and a second field plate structure in electrical connection to the second semiconductor region. The first and/or the second field plate structure may comprise one, two, three or more field plates, wherein the field plates of the same field plate structure partly or fully overlap each other laterally.

According to some embodiments, the at least one of the first and the second field plate structure comprises a stack of at least three interconnected field plates above each other, wherein at least one of the field plates of the stack comprises polysilicon and at least one of the field plates of the stack comprises a metal. Alternatively or additionally, the lateral high voltage semiconductor device may further comprise a third field plate structure in electrical connection to a first portion of the extension region, and fourth field plate structure in electrical connection to a second portion of the extension region, wherein the third field plate structure is connected to the first portion of the extension region at a side of the third field plate structure closer to the first semiconductor region along first lateral direction than a centroid of the third field plate structure, and wherein the fourth field plate structure is connected to the second portion of the extension region at a side of the fourth field plate structure closer the second semiconductor region along first lateral direction than a centroid of the fourth field plate structure. In other words, both of the third and fourth field plate structures are connected asymmetrically relative to their lateral center, wherein a protrusion of the respective field plate structure over the connection facing towards a lateral center of the extension region is greater than a protrusion of the respective field plate structure over the connection facing away from the lateral center of the extension region.

The first and the second portion of the extension region, where the third and the fourth field plate structure are connected to the extension region may comprise a respective mesa protruding at the frontside of the semiconductor substrate. Hence, the third field plate structure may be connected to a first of the at least one mesa protruding at the frontside of the semiconductor substrate. Analogously, the fourth field plate structure may be connected to a second mesa protruding at the frontside of the semiconductor substrate. The field plate structures may be arranged at least partly or fully above the at least one mesa. Each of the field plate structures may at least partly laterally overlap the respective mesa connected thereto.

The third and the fourth field plate structure may comprise a stack of at least three interconnected field plates above each other. At least one of the field plates of the stack may comprise polysilicon and at least one of the field plates of the stack may comprise a metal.

In one or more of the field plate structures, e.g. the first and the second field plate structure and/or the third and the fourth field plate structure, the uppermost of the at least three interconnected field plates may comprise a metal or even consist of a metal while the bottommost of the at least three interconnected field plates comprises polysilicon. Each of the field plates of a respective field plate structure may partly or fully overlap laterally with all lower field plates of the same field plate structure. Hence, the uppermost of the at least three interconnected field plates may fully overlap laterally with all field plates of the same field plate structure.

The at least one mesa may be an elevated region compared to surrounding portions of the extension region. In other words, at the mesa, the substrate may extend higher than portions neighboring of the mesa. In the mesa regions, the substrate may even have a greater thickness compared to neighboring portions.

The at least one mesa may be part of a field ring within the semiconductor substrate. In case of two or more such mesas, each mesa may be part of a respective field ring. The field rings may extend below and/or besides the mesa. The field rings may be part of the extension region. In each field ring, the doping concentration may be higher than in surrounding portions of the extension region. The conductivity type of the doping within the field ring may be the same or opposite to the surrounding portions of the extension region. The field rings may be laterally centered around the respective mesa.

The lateral high voltage semiconductor device may further comprise a first insulating layer laterally adjacent to the at least one mesa on both sides of the at least one mesa. In other words, the portions neighboring the at least one mesa may be covered with the first insulating layer. The first insulating layer may have a same vertical extension as the at least one mesa and/or a top surface of the insulating layer and a top surface of the mesa form an at least substantially flat surface.

Portions of the insulating layer may be arranged in-between the at least one mesa and the first semiconductor region and the in-between the at least one mesa and the second semiconductor region. Alternatively or additionally, portions of the insulating layer may be arranged in-between at least two separate ones of the at least one mesa.

The lateral high voltage semiconductor device may further comprise at least one second insulating layer above the first insulating layer and the at least one mesa. The second insulating layer above may comprise a same material or even a same composition as the first insulating layer. The first and the second insulating layer may be made in a single or in separate manufacturing steps. The first and/or the second layer may comprise an oxide, e.g. silicon oxide, or a nitride, e.g. silicon nitride. The first layer may for example comprise a thermally grown oxide and the second layer, in contrast, may comprise a deposited oxide.

The respective electrical connection connecting one of the field plates to a semiconductor portion or a semiconductor region may be configured to provide a low ohmic contact between said field plate structure and said semiconductor portions or semiconductor region, or may comprise a pn junction or a Schottky junction between said field plate structure to said mesa. The region of the electrical connection may be laterally structured along a main extension direction of the respective mesa the electrical connection is associated with. The main extension direction of the mesa may be in parallel to the frontside of the substrate and perpendicular to the current flow between the first and the second semiconductor region (or a thought line between the first and the second semiconductor region). In the section though the device, the main extension direction of the mesa may be parallel to the frontside and perpendicular to the first lateral direction. Hence, the main extension direction of the mesa may, in said section, be parallel to the second lateral direction.

The electrical connection may be configured to provide a low ohmic contact between the third and fourth field plate structure and the respective portion of the extension region. Alternatively or additionally, the electrical connection may comprise a rectifying junction, e.g. a pn junction or a Schottky junction, between said field plate structure and the respective portion of the extension region.

If the third and fourth field plate structures are connected to a respective mesa, electrical connection may be configured to provide a low ohmic contact between the third and fourth field plate structure and the respective mesa. Alternatively or additionally, the electrical connection may comprise a rectifying junction, e.g. a pn junction or a Schottky junction, between said field plate structure and the respective mesa.

The field plate structures may be embedded in an insulating material, e.g. the second insulating layer. For example, each field plate structures may be fully enclosed by the insulating material with only the electrical connection connecting through the insulating material.

Each rectifying junction may comprise a first portion and a second portion, a joint face between said portions forming said junction, wherein the mesa is patterned laterally into the first and second portions. In case of a pn-junction, the first portion may have the first conductivity type and the second portion may have the second conductivity type, wherein the pn junction is formed between the first and the second portion.

For example, the mesa is patterned along the first lateral direction resulting in the joint face extending in a second lateral direction perpendicular to the first lateral direction. For example, the mesa is patterned along the second lateral direction resulting in the joint face extending in the first lateral direction.

For example, in case of an ohmic connection, the electrical connection may connect the mesa only asymmetrically, e.g. close to a lateral edge. For example, in case of a pn-junction, one of the portions of the junction may have a greater lateral extension compared to the other one. In this case, the smaller portion of the junction may only extend close to a lateral edge of the mesa.

The lateral high voltage semiconductor device may further comprise a high voltage (HV) routing layer above the at least one field plate structure. The high voltage routing layer may be insulated from the at least one field plate structure by an insulating layer, e.g. the second insulating layer.

For example, at least 50% or even at least 70% or even at least 85% of the semiconductor element may be laterally overlapped by the field plate structures collectively. This may provide effective shielding of the semiconductor element against the HV routing layer.

The semiconductor substrate may comprise a backside opposite to the frontside. The lateral high voltage semiconductor device may comprise a backside insulating layer arranged to the backside of the semiconductor substrate. The insulating layer may comprise an oxide layer. The oxide layer may have a thickness of 0.5 µm to 20 µm and preferably 2 µm to 20 µm. The oxide layer may be deposited onto the backside. This allows for a great scalability of the voltage class of the semiconductor device, as the thickness of the deposited oxide can be chosen easily in dependence from the desired breakdown voltage. A combined thickness of the semiconductor substrate and the backside insulating layer may range from 20.5 µm to 100 µm ((20 µm to 100 µm for the semiconductor substrate)+(0.5 µm to 20 µm for the insulating layer)).

The lateral high voltage semiconductor device may further comprise an additional silicon layer below the backside of the semiconductor substrate. For example, the additional silicon layer may be attached directly or indirectly to the backside insulating layer. For example, one or more adhesion promotion layers may be arranged in-between the backside insulating layer and the additional silicon layer. The one or more adhesion promotion layer may include a tape, e.g. a DAF tape. For example, alternatively or additionally to the one or more adhesion promotion layers one or more further layer may be arranged in-between the backside insulating layer and the additional silicon layer. The one or more further layer may include one or more dielectric and/or one or more metal layer.

The lateral high voltage semiconductor device may further comprise at least one insulating trench electrically insulating the semiconductor element from a further semiconductor element neighboring the semiconductor element on the same semiconductor substrate. The insulating trench may comprise a trench electrode. Said trench electrode may comprise with doped or undoped polysilicon. Said trench electrode may be floating or be connected to any potential. The at least one insulating trench may extend from the frontside to the backside of the substrate where it adjoins the backside insulating layer.

In the following detailed description, reference is made to the accompanying drawings, which form a part hereof and in which are shown by way of illustrations specific embodiments in which a gate driver device may be practiced. Other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

The term "power semiconductor device" refers to semiconductor devices with a high voltage blocking capability of at least 30 V, for example 48 V, 100 V, 600 V, 1.6 kV, 3.3 kV or more and with a nominal on-state current or forward current of at least 200 mA, for example 1 A, 10 A or more.

The semiconductor element may be configured as diode, any kind of FET (MOSFET, JFET, etc.), bipolar transistor, IGBT, or the like. MOSFETs (metal oxide semiconductor field effect transistor) are voltage-controlled devices and include all types of IGFETs (insulated gate field effect transistors) with gate electrodes based on doped semiconductor material and/or metal and with gate dielectrics made of oxide and/or dielectric materials other than oxides.

An ohmic contact describes a non-rectifying electrical junction between two conductors, e.g., between a semiconductor material and a metal. The ohmic contact has a linear or approximately linear current-voltage (I-V) curve in the first and third quadrant of the I-V diagram as with Ohm's law.

Ranges given for physical dimensions include the boundary values. For example, a range for a parameter y from a to b reads as $a \leq y \leq b$. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

Two adjoining doping regions in a semiconductor layer form a semiconductor junction. Two adjoining doping regions of the same conductivity type and with different dopant concentrations form a unipolar junction, e.g., an n/n+ or p/p+ junction along a boundary surface between the two doping regions. At the unipolar junction a dopant concentration profile orthogonal to the unipolar junction may show a step or a turning point, at which the dopant concentration profile changes from being concave to convex, or vice versa. Two adjoining doping regions of complementary conductivity type form a pn junction.

The first conductivity type may be the n-type and the second conductivity type may be the p-type. In this case, semiconductor regions of the first conductivity type may comprise surplus of donator like dopants and semiconductor regions of the second conductivity type may comprise surplus of acceptor like dopants. Alternatively, the first conductivity type may be the p-type and the second conductivity type may be the n-type. In this case, semiconductor regions of the first conductivity type may comprise surplus of acceptor like dopants and semiconductor regions of the second conductivity type may comprise surplus of donator like dopants.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Embodiments of the present disclosure concern a high voltage semiconductor device that includes a low side part and a high side part. The high voltage semiconductor device can be a gate driver device. The low side part outputs a first gate drive signal between a first gate output and a first reference potential VSS. The high side part outputs a second gate drive signal between a second gate output and a second reference potential VS. The high side part also generates a high side data signal.

The low side part includes electric circuits of a low voltage domain. The low voltage domain outputs the first gate drive signal and may further include electric circuits of a CMOS interface for communicating with standard CMOS devices having input voltages below 5V. The electric circuits for the CMOS interface and the electric circuits for driving the first gate drive signal may be isolated from each other or may be parts of a one-part voltage domain.

The first gate drive signal output by the low side part may be capable of driving a gate of a low side switch of an electronic half bridge. The second gate drive signal output by the high side part may be capable of driving a high side switch of the same half bridge. The half bridge may be part of a H-bridge that switches the polarity of a voltage applied to a load.

The above-mentioned breakdown voltage of at least 80 V or even at least 300 V may apply between the low side and the high side. The breakdown voltage within the respective voltage domain of the low side and/or the high side may be smaller, e.g. less than 80 V or less than 50 V. The breakdown voltage of the semiconductor element, however, may also be at least 80 V or even at least 300 V. The semiconductor element may establish and/or control an electrical connection between the different voltage domains of the high voltage semiconductor device, e.g. the high side and the low side in case of a gate driver device.

The semiconductor substrate may include a conductive, e.g., a doped semiconductor material. The substrate may be a homogenous layer or a layer stack including two or more sublayers of different composition and/or internal structure of the semiconductor material. For example, the semiconductor substrate is a silicon, Si, or a gallium arsenide, GaAs, or a gallium nitride, GaN, or a silicon carbide, SiC, wafer. A thickness of the semiconductor substrate can be in a range from 4 μm to 200 μm, or more particularly in a range from 20 μm to 150 μm.

Figure 1:
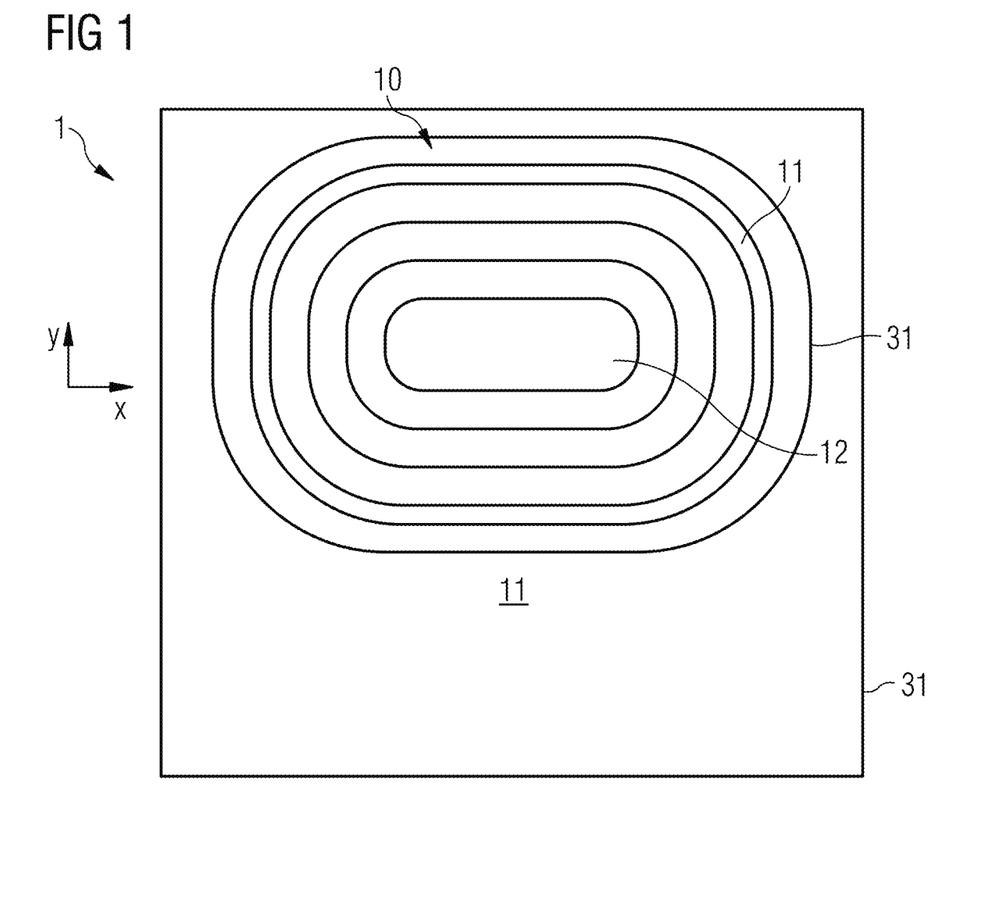
FIG. 1 illustrates a schematic top view of a power semiconductor device.

FIGS. 1 through 4 each show a lateral high voltage semiconductor device 1. FIG. 1 is a top highly schematic top view on the device, whereas all other figures show lateral sections through the service. The semiconductor device 1 comprises a semiconductor substrate 2, e.g. comprising silicon, Si, or silicon carbide, SiC. The device 1 comprises at least one semiconductor element 10. The semiconductor element 10 comprises at least a first semiconductor region 11 of a first conductivity type formed within the semiconductor substrate 2 and a second semiconductor region 12 formed within the semiconductor substrate 2. The first semiconductor region 11 and second semiconductor region 12 are spaced apart from each other along a first lateral direction x parallel to the frontside. The substrate 2 may have the first or the second conductivity type. Usually, the substrate 2 may have the p-type doping.

Both regions 11, 12 may be connected via an extension region 13 adjoining the second semiconductor region 12. The extension region 13 have the second conductivity type. The extension region 13 may be configured to shield or take over an electrical field between the first and second semiconductor regions 11, 12. Therefore, the extension region 13 may be configured to take over a nominal voltage or breakdown voltage of the device 1 between both region 11, 12. The extension region 13 may be lighter doped than the second semiconductor region 12. The doping concentration of the extension region 13 may, for example, be at least two, at least 3 or at least 5 magnitudes smaller than the doping concentration of the second semiconductor region 12. The doping concentration of the extension region 13 may, for example, be at least two, at least 3 or at least 5 magnitudes smaller than the doping concentration of the first semiconductor region 11.

Figure 2:
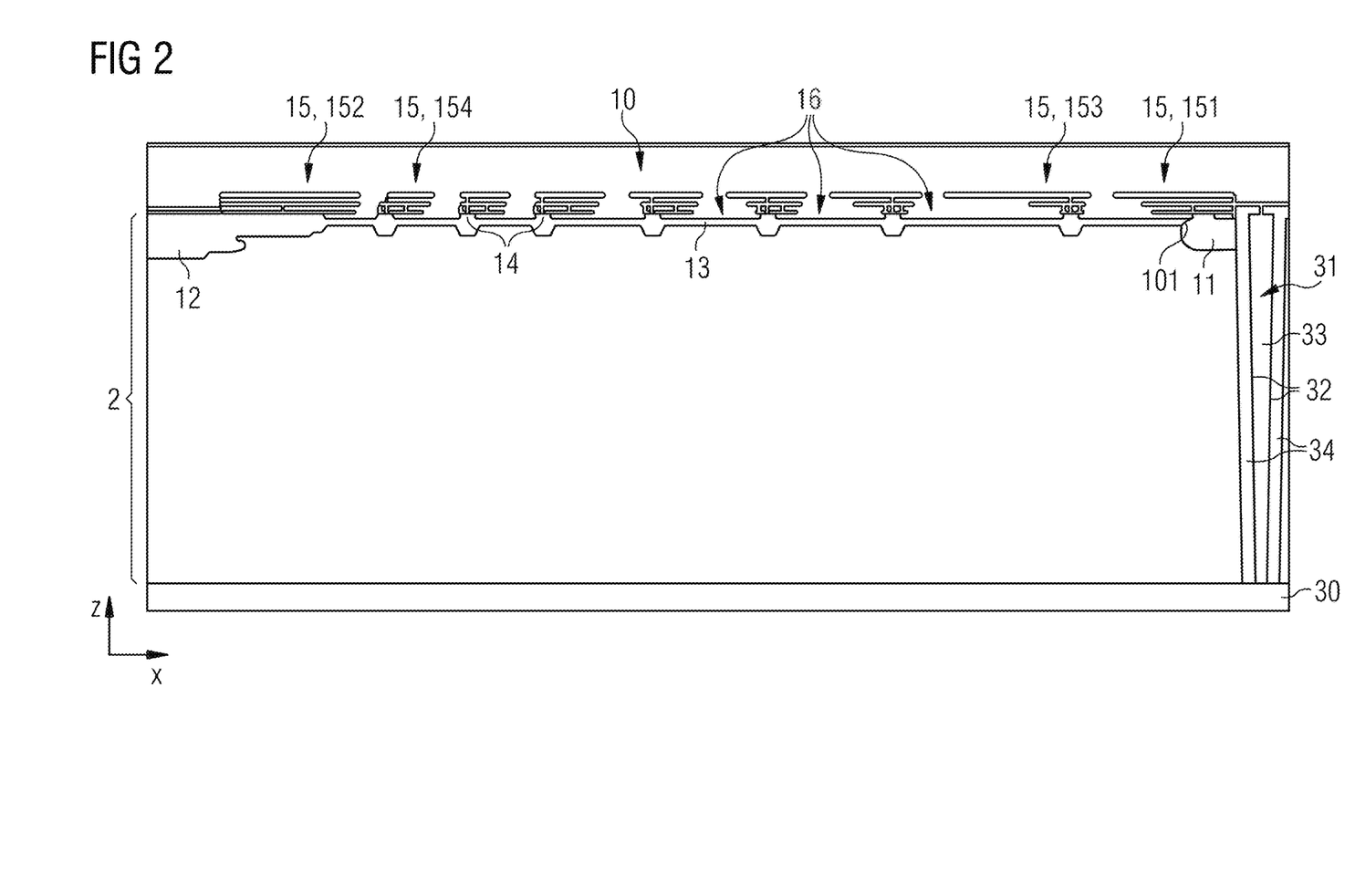
FIG. 2 illustrates a schematic section of a power semiconductor device.
Figure 3:
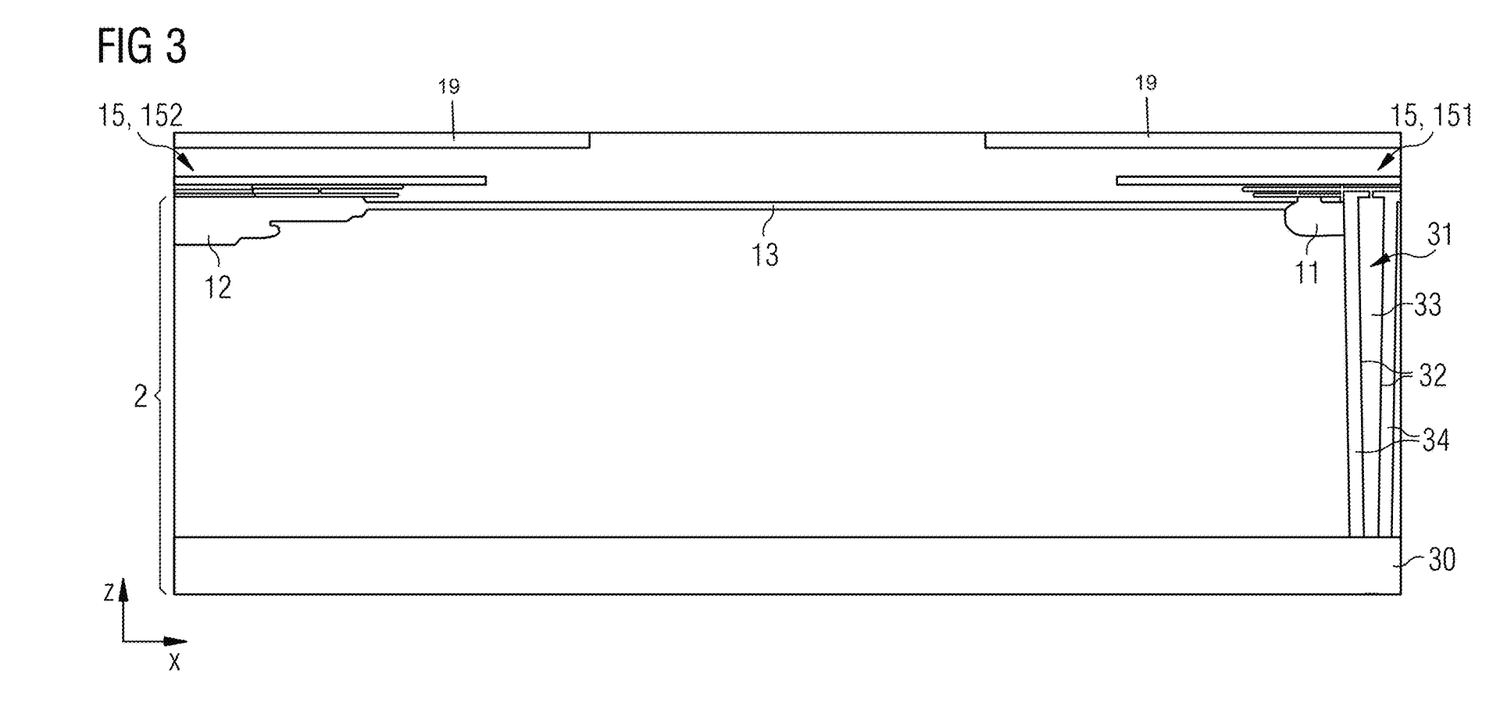
FIG. 3 illustrates a schematic section of a power semiconductor device.
Figure 4:
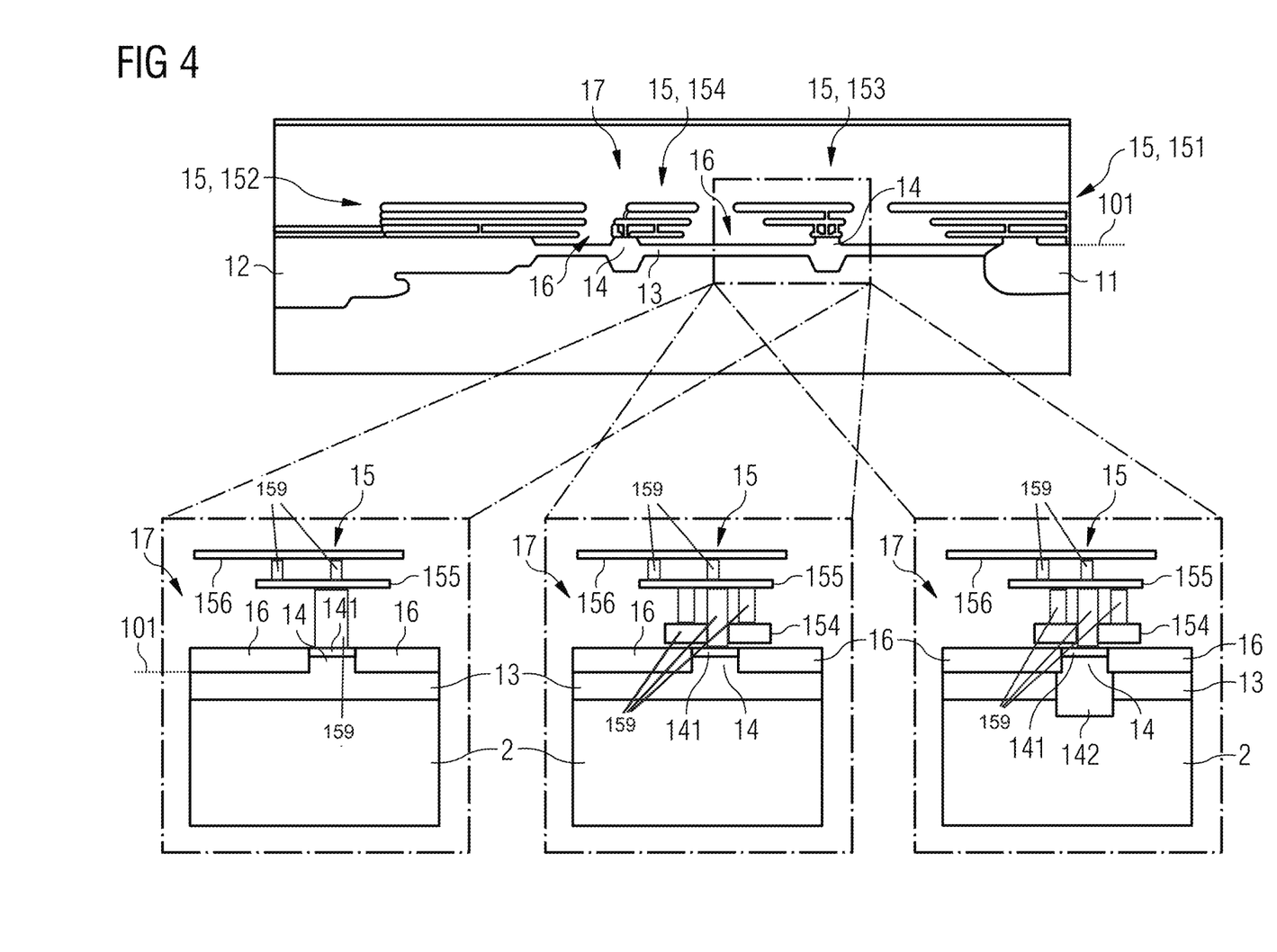
FIG. 4 illustrates a schematic section of a power semiconductor device and shows different examples of field plates structures in more detail.

Now referring to FIG. 2 through 4, the lateral high voltage semiconductor device 1 comprises a plurality of mesas 14 protruding at the frontside of the semiconductor substrate 2. The mesas 14 are an elevated region compared to surrounding portions of the extension region 13. In other words, at the mesa 13, the substrate 2 may extend higher than in portions (where a substrate 2 is covered with the insulating layer 16) neighboring of the mesa 14. In the mesa regions 14, the substrate 2 may even have a greater thickness compared to neighboring portions (where a substrate 2 is covered with the insulating layer 16).

A main extension direction of the mesa 14 may be in parallel to the frontside of the substrate and perpendicular to the current flow between the first and the second semiconductor region 11, 12 (or a thought line between the first and the second semiconductor region 11, 12). In the section though the device, the main extension direction of the mesa 14 extends parallel to the y-axis. The main extension direction of the mesas 14 may be parallel to the frontside and perpendicular to the first lateral direction x. Hence, the main extension direction of the mesas 14 may, in said section, be parallel to the second lateral direction y.

Portions of the insulating layer 16 are arranged in-between the respective ones of the mesas 14. A portion of the insulating layer 16 is arranged in-between one mesas 14 and the first semiconductor region 11 as the first semiconductor region 11 comprises an elevated portion protruding from the frontside. Another portion of the insulating layer 16 is arranged in-between one mesas 14 the second semiconductor region 12 as the second semiconductor region 12 comprises an elevated portion protruding from the frontside.

The lateral high voltage semiconductor device further comprises a plurality of first field plate structures 15. The first field plate structures 15 are electrical connection to one of the first semiconductor region 11, the second semiconductor region 12, or the mesa 14. A first field plate structure 151 is connected to the first semiconductor region 11. A second field plate structure 152 is connected to the second semiconductor region 12. A third field plate structure 153 is connected to a first mesa 14. A fourth field plate structure 154 is connected to a second mesa 14. The field plate structures 15 may each comprise one, two, three or more field plates, wherein the field plates 154, 155, 156 of the same field plate structure 15 partly or fully overlap each other laterally. For example, the bigger ones of the field plates may fully overlap the smaller ones of the field plates of the same field plate structure. Each of the field plate structures 15 associated to a mesa 14 at least partly laterally overlaps the respective mesa 14 connected thereto.

Different embodiments of the field plates structures are depicted in FIG. 4 with greater detail. The field plates 154, 155, 156 of the same field plate structure 15 may be interconnected via connections 159. The lowermost field plate 154 of the respective field plate structures 15 may be connected to one of the mesa 14 or one of the first and second semiconductor region 11, 12 via a bottom connection 159. The third and the fourth field plate structure 153, 154 are connected to the extension region 13 via the respective associated mesa 14.

The at least one mesa 14 may be part of a field ring within the semiconductor substrate (cf. FIGS. 1 through 3). In case of two or more such mesas 14, each mesa 14 may be part of a respective field ring. The field rings may extend below and/or besides the mesa 14. The field rings may be part of the extension region 13. In each field ring, the doping concentration may be higher than in surrounding portions of the extension region. The conductivity type of the doping within the field ring may be the same or opposite to the surrounding portions of the extension region. The field ring associated with the mesa 14 may be laterally centered around the respective mesa 14. The field rings may each comprise a field ring doping region 142 (cf. FIG. 4) of the same or the opposite conductivity type as the extension region 13.

According to some embodiments depicted in FIG. 4, the field plate structures 15 comprise a stack of at least three interconnected field plates 154, 155, 156 above each other, wherein at least one of the field plates 154 of the stack comprises polysilicon and at least one of the field plates 155, 156 of the stack 15 comprises a metal.

In one or more of the field plate structures 15, e.g. the first and the second field plate structure 151, 152 and/or the third and the fourth field plate structure 153, 154, the uppermost field plate 156 of the at least three interconnected field plates 154, 155, 156 may comprise a metal or even consist of a metal while the bottommost 154 of the at least three interconnected field plates 154, 155, 156 of the structure 15 comprises polysilicon. Each of the field plates of a respective field plate structure may partly or fully overlap laterally with all lower field plates of the same field plate structure. Hence, the uppermost of the at least three interconnected field plates may fully overlap laterally with all field plates 154, 155, 156 of the same field plate structure 15.

Referring to FIG. 4, the third field plate structure 153 is connected to a first portion of the extension region 13 at a side of the third field plate structure 153 closer to the first semiconductor 11 region along first lateral direction x than a centroid of the third field plate structure 153. The fourth field plate structure 154 is connected to a second portion of the extension region 13 at a side of the fourth field plate structure 154 closer the second semiconductor region 12 along the first lateral direction x than a centroid of the fourth field plate structure 154. In other words, both of the third and fourth field plate structures 153, 154 are connected asymmetrically relative to their lateral center, wherein a protrusion of the respective field plate structure 153, 154 over the connection 159 facing towards a lateral center of the extension region 13 is greater than a protrusion of the respective field plate structure 153, 154 over the connection facing away from the lateral center of the extension region 13.

The respective electrical connection 158, 159 connecting one of the field plates 154 of a field plate structure 15 to a semiconductor portion or a semiconductor region may be configured to provide a low ohmic contact between said field plate structure 15 and said semiconductor portions or a semiconductor region, or comprises a pn junction or a Schottky junction between said field plate structure 15 to said mesa 14. In the three lower examples of FIG. 4, the field plate structures 15 are connected to the mesas 14/the extension region via doped regions 141. The doped regions 14 may have the same conductivity type as the extension region 13 with higher dose to improve the contact resistance. The doped regions 14 may have the opposite conductivity type as the extension region 13 with higher dose to form a rectifying junction. The region of the electrical connection may be laterally structured along the main extension direction of the respective mesa the electrical connection is associated with.

The insulating layer 16 may comprise a first insulating 161 layer laterally adjacent to the at least one mesa on both sides of the at least one mesa. In other words, the portions neighboring the at least one 14 mesa may be covered with the first insulating layer. The first insulating layer 161 may have a same vertical extension as the at least one mesa 14 and/or a top surface of the insulating layer 161 and a top surface of the mesa 14 form an at least substantially flat surface.

The insulating layer 16 comprises a first insulating 161 and may further comprise at least one second insulating layer 162 above the first insulating layer 161 and the at least one mesa 14. The second insulating layer 162 above may comprise a same material or even a same composition as the first insulating layer 161. The first and second layer 161, 162 may have a different composition, e.g., a different material or different physical properties. The first and the second insulating layers 161, 162 may be made in a single or in separate manufacturing steps. The first and/or the second layer 161, 162 may comprise an oxide, e.g. silicon oxide, or a nitride, e.g. silicon nitride. The first layer 161 may for example comprise a thermally grown oxide and the second layer, in contrast, may comprise a deposited oxide.

The semiconductor element 10 may implement an electronic component or an electronic device. For example, the semiconductor element may be a transistor (e.g. a bipolar junction transistor, BJT, or a field effect transistor, FET, or a junction-gate field-effect transistor, JFET), or a diode (e.g. a pn-diode or a Zener diode), or an insulated gate bipolar transistor, IGBT, or a thyristor, or the like.

Now referring to FIGS. 8 through 11, in case of the semiconductor element 10 being a transistor like device, the semiconductor element 10 may further comprise a body region 110 of a second conductivity type laterally adjoining the first semiconductor region 11 and the extension region 13, and a gate structure 113 configured to control the lateral load current between the first and the second semiconductor region 11, 12. The gate region 113 may be insulated from the body region 110. The gate region may be configured to form an inversion channel in the body region for controlling the lateral load current. The first semiconductor 11 region may be a source or emitter region 111 of the transistor and the second semiconductor region may be a drain or collector region 112 of the transistor. The second semiconductor region 12 or drain or collector region 112 may have the first conductivity type. The extension region 13 may also have the first conductivity type.

Figure 9:
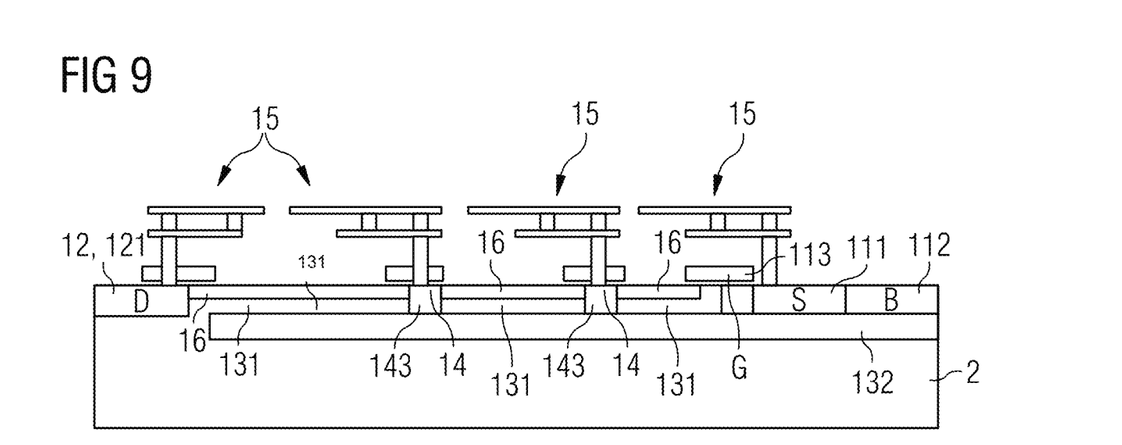
Figure 10:
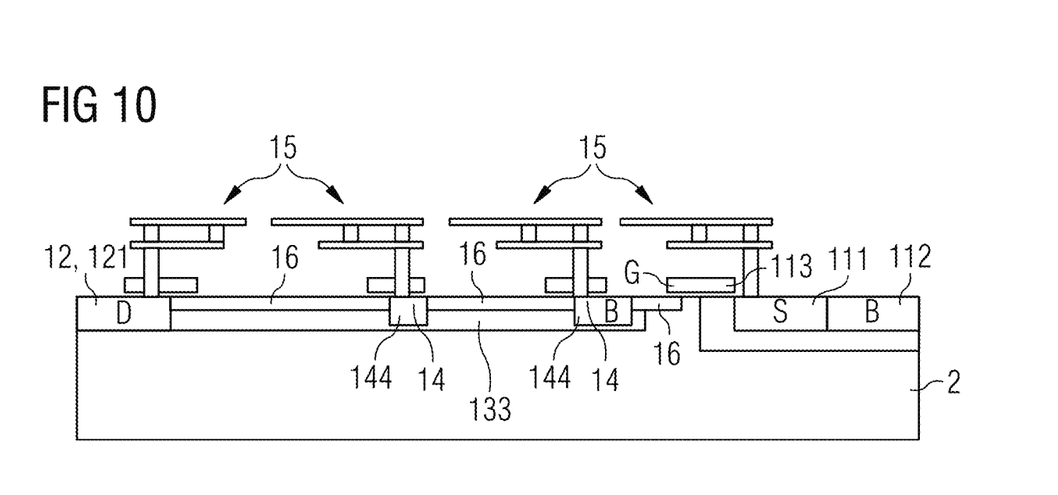
Figure 11:
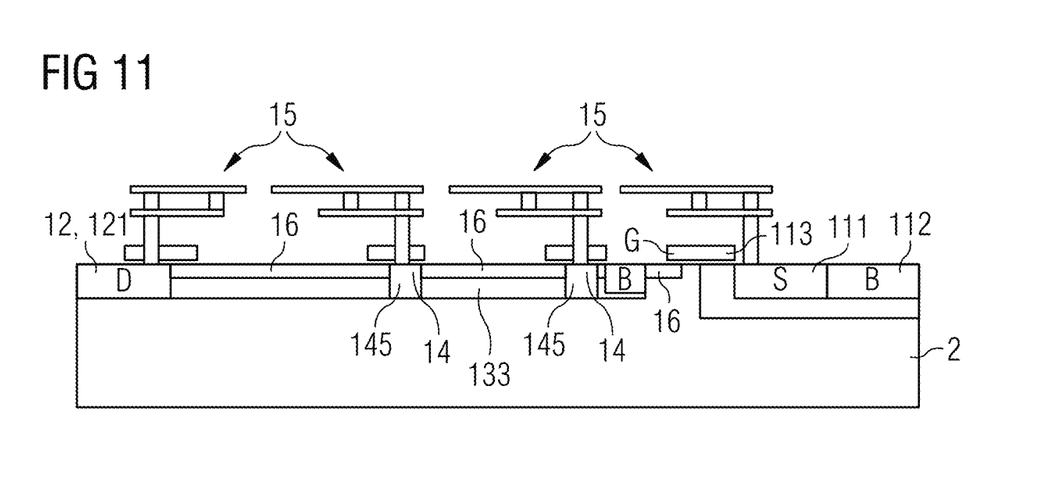

Referring to FIG. 10, some of the mesa regions 14 may be configured as base region 144. Associated field plate structures are connected to the base regions 144. Referring to FIG. 9, the device 1 comprises an additional extension region of the opposite conductivity type compared to the extension region 13.

Figure 5:
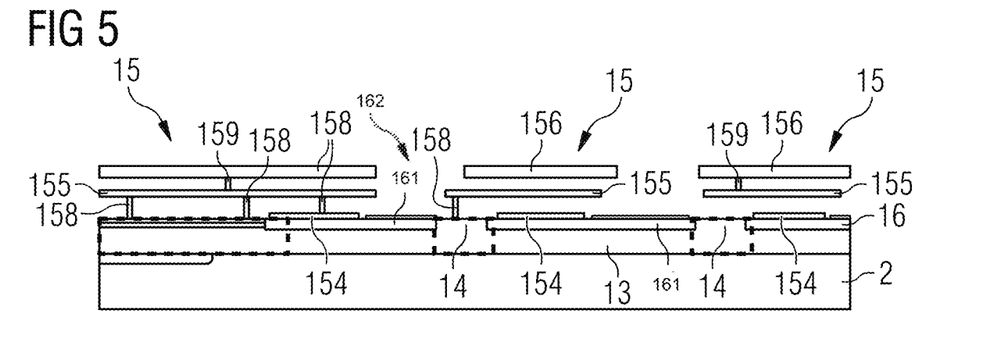
FIGS. 5 to 7 illustrate more schematic sections of exemplary power semiconductor devices.
Figure 6:
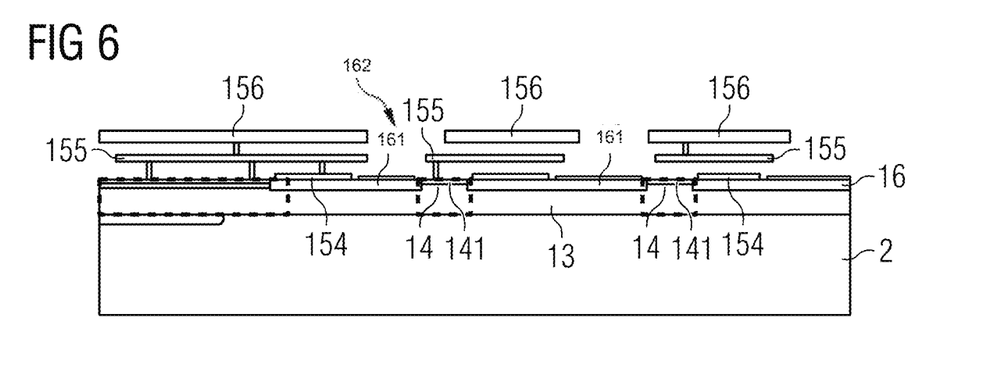
Figure 7:
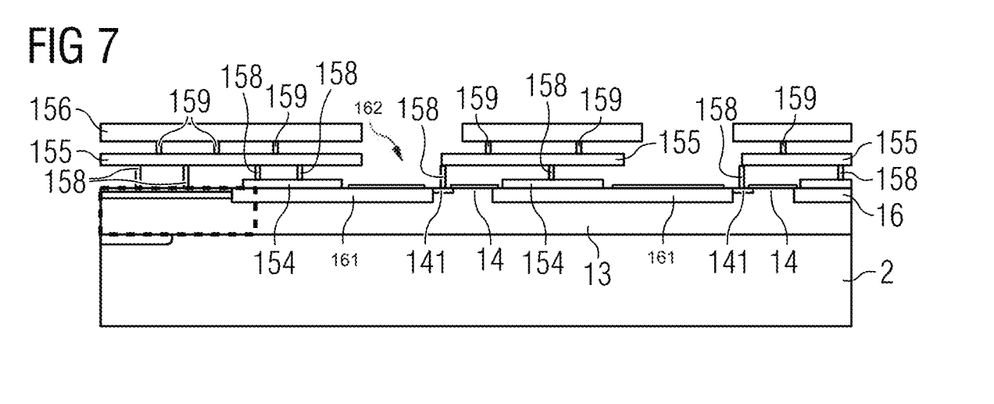
Figure 8:
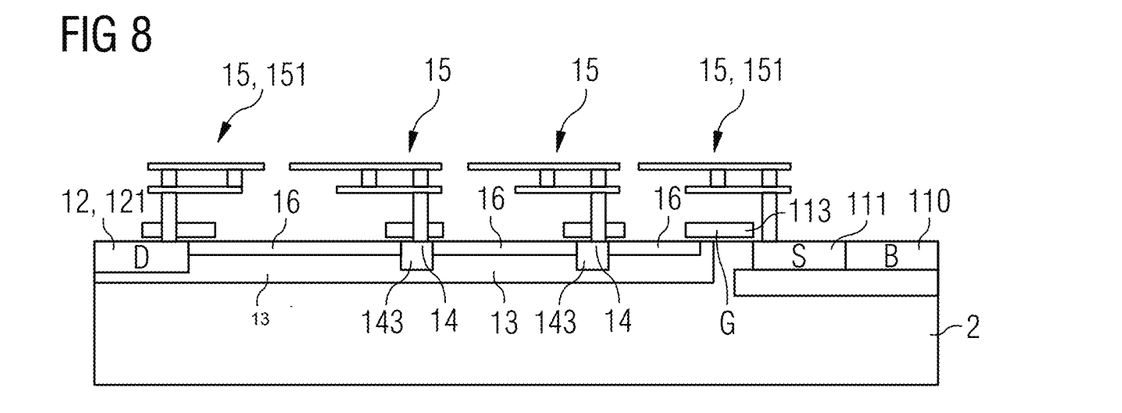
FIGS. 8 to 11 illustrate more schematic sections of exemplary power semiconductor devices in a transistor configuration.

The field plate structures may be embedded in an insulating material, e.g. the second insulating layer 162 (cf. FIGS. 5 through 7). For example, each field plate structure 15 may be fully enclosed by the insulating material 162 with only the electrical connection 158, 159 connecting through the insulating material 162.

For example, the mesa 14 is patterned along the first lateral direction resulting in the joint face extending in a second lateral direction perpendicular to the first lateral direction. For example, the mesa is patterned along the second lateral direction resulting in the joint face extending in the first lateral direction.

For example, in case of an ohmic connection, the electrical connection 158, 159 may connect the mesa 14 only asymmetrically, e.g. close to a lateral edge of the mesa 14. For example, in case of a pn-junction, one of the portions of the junction may have a greater lateral extension compared to the other one. In this case, the smaller portion of the junction may only extend close to a lateral edge of the mesa 14.

The lateral high voltage semiconductor device 1 may further comprise a high voltage (HV) routing layer 19 (cf. FIG. 3) above the at least one field plate structure 15. The high voltage routing layer 19 may be insulated from the at least one field plate structure 15 by an insulating layer 16, e.g. the second insulating layer 162.

For example, at least 50% or even at least 70% or even at least 85% of the semiconductor element 10 may be laterally overlapped by the field plate structures 15 collectively. This may provide effective shielding of the semiconductor element 10 against the HV routing layer 19.

The semiconductor substrate 2 may comprise a backside opposite to the frontside. The lateral high voltage semiconductor device may comprise a backside insulating layer 30 arranged to the backside of the semiconductor substrate 2. The backside insulating layer 30 may comprise an oxide layer. The oxide layer may have a thickness of 0.5 µm to 20 µm and preferably 2 µm to 20 µm. The oxide layer may be deposited onto the backside. This allows for a great scalability of the voltage class of the semiconductor device 1, as the thickness of the deposited oxide can be chosen easily in dependence from the desired breakdown voltage. A combined thickness of the semiconductor substrate 2 and the backside insulating layer 30 may range from 20.5 µm to 100 µm ((20 µm to 100 µm for the semiconductor substrate)+(0.5 µm to 20 µm for the insulating layer)).

The lateral high voltage semiconductor device may further comprise an additional silicon layer below the backside of the semiconductor substrate. For example, the additional silicon layer may be attached directly or indirectly to the backside insulating layer. For example, one or more adhesion promotion layers may be arranged in-between the backside insulating layer and the additional silicon layer. The one or more adhesion promotion layer may include a tape, e.g. a DAF tape. For example, alternatively or additionally to the one or more adhesion promotion layers one or more further layer may be arranged in-between the backside insulating layer and the additional silicon layer. The one or more further layer may include one or more dielectric and/or one or more metal layer.

The lateral high voltage semiconductor device may further comprise at least one insulating trench 31 electrically insulating the semiconductor element from a further semiconductor element neighboring the semiconductor element 10 on the same semiconductor substrate 2. The insulating trench 31 may comprise a trench electrode 33. Said trench electrode 33 may comprise with doped or undoped polysilicon. Said trench electrode 33 may be floating or be connected to any potential (e.g. the potential of the first or the second semiconductor region 11,12. The at least one insulating trench 31 may extend from the frontside to the backside of the substrate where it adjoins the backside insulating layer 30. The insulating trench 31 may comprise one or more trench insulating layers 34, e.g., comprising an oxide layer.

Although specific examples have been illustrated and described herein, it will be appreciated by those of ordinary skill in the art that a variety of alternate and/or equivalent implementations may be substituted for the specific examples shown and described without departing from the scope of the present invention. This application is intended to cover any adaptations or variations of the specific examples discussed herein. Therefore, it is intended that this invention be limited only by the claims and the equivalents thereof.

It should be noted that the methods and devices including its preferred embodiments as outlined in the present document may be used stand-alone or in combination with the other methods and devices disclosed in this document. In addition, the features outlined in the context of a device are also applicable to a corresponding method, and vice versa. Furthermore, all aspects of the methods and devices outlined in the present document may be arbitrarily combined. In particular, the features of the claims may be combined with one another in an arbitrary manner.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiments outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A lateral high voltage semiconductor device, comprising:
    a semiconductor substrate with a frontside;
    a semiconductor element comprising:
        a first semiconductor region of a first conductivity type formed within the semiconductor substrate;
        a second semiconductor region formed within the semiconductor substrate and spaced apart from the first semiconductor region in a first lateral direction parallel to the frontside; and
        an extension region adjoining the second semiconductor region,
    wherein the semiconductor device is configured to control a load current between the first semiconductor region and the second semiconductor region,
    wherein the extension region extends along the frontside of the semiconductor substrate and comprises at least one mesa protruding at the frontside of the semiconductor substrate.

2. The lateral high voltage semiconductor device of claim 1, further comprising:

at least one field plate structure at least partly above a respective one of the at least one mesa; and
an electrical connection connecting the at least one field plate structure to the respective mesa.

3. The lateral high voltage semiconductor device of claim 2, further comprising a high voltage routing layer above the at least one field plate structure.

4. The lateral high voltage semiconductor device of claim 2, wherein at least 50% or even at least 70% of the semiconductor element is laterally overlapped by the at least on field plate structure.

5. The lateral high voltage semiconductor device of claim 1, further comprising a first insulating layer laterally adjacent to the at least one mesa on both sides of the at least one mesa.

6. The lateral high voltage semiconductor device of claim 1, further comprising at least one field ring at least partly arranged within the at least one mesa.

7. A lateral high voltage semiconductor device, comprising:
a semiconductor substrate with a frontside;
a semiconductor element comprising:
a first semiconductor region of a first conductivity type formed within the semiconductor substrate;
a second semiconductor region spaced apart from the first semiconductor region in a first lateral direction parallel to the frontside; and
an extension region adjoining the second semiconductor region,
wherein the semiconductor device is configured to control a lateral load current between the first semiconductor region and the second semiconductor region;
a first field plate structure in electrical connection to the first semiconductor region; and
a second field plate structure in electrical connection to the second semiconductor region,
wherein at least one of the first and the second field plate structure comprises a stack of at least three interconnected field plates above each other,
wherein at least one of the field plates of the stack comprises polysilicon and at least one of the field plates of the stack comprises a metal.

8. The lateral high voltage semiconductor device of claim 7, further comprising:
a third field plate structure in electrical connection to a first portion of the extension region; and
a fourth field plate structure in electrical connection to a second portion of the extension region,
wherein the third field plate structure is connected to the first portion of the extension region at a side of the third field plate structure closer to the first semiconductor region along first lateral direction than a centroid of the third field plate structure,
wherein the fourth field plate structure is connected to the second portion of the extension region at a side of the fourth field plate structure closer the second semiconductor region along first lateral direction than a centroid of the fourth field plate structure.

9. The lateral high voltage semiconductor device of claim 7, wherein the extension region extends along the frontside of the semiconductor substrate and comprises at least one mesa protruding at the frontside of the semiconductor substrate.

10. The lateral high voltage semiconductor device of claim 9, further comprising a first insulating layer laterally adjacent to the at least one mesa on both sides of the at least one mesa.

11. The lateral high voltage semiconductor device of claim 10, wherein the first insulating layer has a same vertical extension as the at least one mesa and/or a top surface of the first insulating layer and a top surface of the mesa form an at least substantially flat surface.

12. The lateral high voltage semiconductor device of claim 10, wherein portions of the first insulating layer are arranged:
in-between the at least one mesa and the first semiconductor region and the in-between the at least one mesa and the first semiconductor region, and/or
in-between at least two separate ones of the at least one mesa.

13. The lateral high voltage semiconductor device of claim 10, further comprising at least one second insulating layer above the first insulating layer and the at least one mesa.

14. The lateral high voltage semiconductor device of claim 9, further comprising at least one field ring at least partly arranged within the at least one mesa.

15. The lateral high voltage semiconductor device of claim 7, wherein each electrical connection is configured to provide a low ohmic contact between the corresponding field plate structure and the respective portion of the extension region.

16. The lateral high voltage semiconductor device of claim 7, wherein each electrical connection comprises a rectifying junction between the field plate structure and the mesa.

17. The lateral high voltage semiconductor device of claim 16, wherein the rectifying junction comprises a first portion and a second portion, wherein a joint face between the first and second portions forms the rectifying junction, and wherein the mesa is patterned laterally into the first and second portions.

18. The lateral high voltage semiconductor device claim 16, wherein:
the mesa is patterned along the first lateral direction resulting in the joint face extending in a second lateral direction perpendicular to the first lateral direction; or
the mesa is patterned along the second lateral direction resulting in the joint face extending in the first lateral direction.

19. The lateral high voltage semiconductor device of claim 7, wherein the semiconductor element further comprises:
a body region of a second conductivity type laterally adjoining the first semiconductor region and the extension region; and
a gate structure configured to control the lateral load current between the first and the second semiconductor region.

20. The lateral high voltage semiconductor device of claim 7, wherein the first semiconductor region is arranged close to or at the frontside, and/or the second semiconductor region is arranged close to or at the frontside.

21. The lateral high voltage semiconductor device of claim 7, further comprising a backside insulating layer arranged at a backside of the semiconductor substrate that is opposite to the frontside.

22. The lateral high voltage semiconductor device of claim 7, further comprising at least one insulating trench electrically insulating the semiconductor element from a further semiconductor element neighboring the semiconductor element on the same semiconductor substrate.

23. The lateral high voltage semiconductor device of claim 7, further comprising:
 a backside insulating layer arranged at a backside of the semiconductor substrate that is opposite to the frontside; and
 at least one insulating trench electrically insulating the semiconductor element from a further semiconductor element neighboring the semiconductor element on the same semiconductor substrate,
 wherein the at least one insulating trench extends from the frontside to the backside of the semiconductor substrate and adjoins the backside insulating layer.

24. A method for forming lateral high voltage semiconductor device, the method comprising:
 providing a semiconductor substrate with a frontside;
 forming mesa regions;
 forming a semiconductor cell comprising:
  a first semiconductor region of a first conductivity type formed within the semiconductor substrate;
  a second semiconductor region spaced apart from the first semiconductor region in a lateral direction parallel to the frontside; and
  an extension region adjoining the second semiconductor region;
 wherein the semiconductor cell is configured to control a lateral load current between the first semiconductor region and the second semiconductor region,
 wherein the extension region extends along the frontside of the semiconductor substrate and the at least one is mesa protrudes at the frontside of the semiconductor substrate.

* * * * *